United States Patent [19]

Takemae et al.

[11] Patent Number: 4,581,720
[45] Date of Patent: Apr. 8, 1986

[54] SEMICONDUCTOR MEMORY DEVICE

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 535,836

[22] Filed: Sep. 26, 1983

[30] Foreign Application Priority Data

Sep. 28, 1982 [JP] Japan ................................ 57-167522

[51] Int. Cl.⁴ .............................................. G11C 7/00
[52] U.S. Cl. .................................... 365/222; 365/189
[58] Field of Search ................ 365/149, 189, 190, 222

[56] References Cited

U.S. PATENT DOCUMENTS 4,203,159 5/1980 Wanlass ............................... 365/222

OTHER PUBLICATIONS

P. T. Wu, "Read/Write Dynamic Memory Using Two Devices Per Cell and Having Internal Refresh", IBM Technical Disclosure Bulletin, vol. 23, No. 10, Mar. 1981, pp. 4620-4621.

Primary Examiner—Joseph A. Popek
Attorney, Agent, or Firm—Staas & Halsey

[57] ABSTRACT

A dynamic memory having single element storage cells. A plurality of gate circuits are connected to the column lines of the storage cell array at both ends of the column line. A plurality of sense amplifiers are disposed along both ends of the column lines and connected to the gate circuits. In accordance with switching of the gate circuits, a portion of the sense amplifiers are coupled with a portion of the column lines to perform a refresh operation and read or write operations for the storage cells connected thereto. Also, the remaining sense amplifiers are coupled with the remaining column lines to perform only the refresh operation of the storage cells connected to the remaining column lines.

21 Claims, 7 Drawing Figures

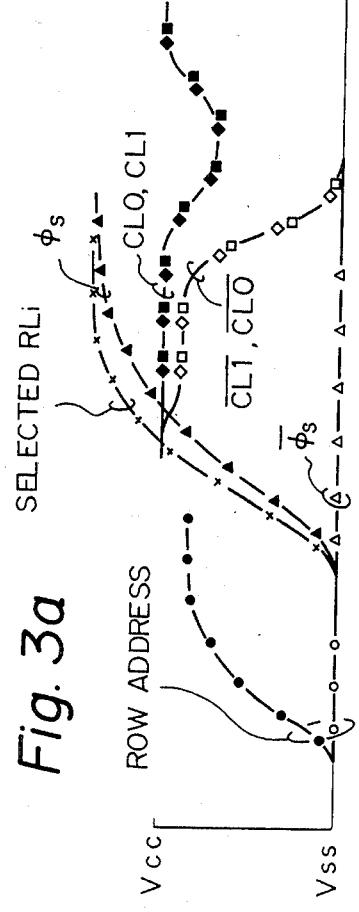
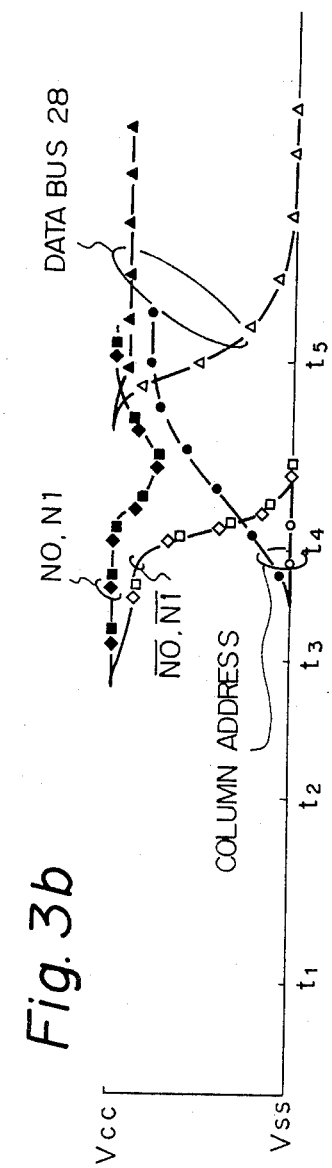
Fig. 3a
Fig. 3b

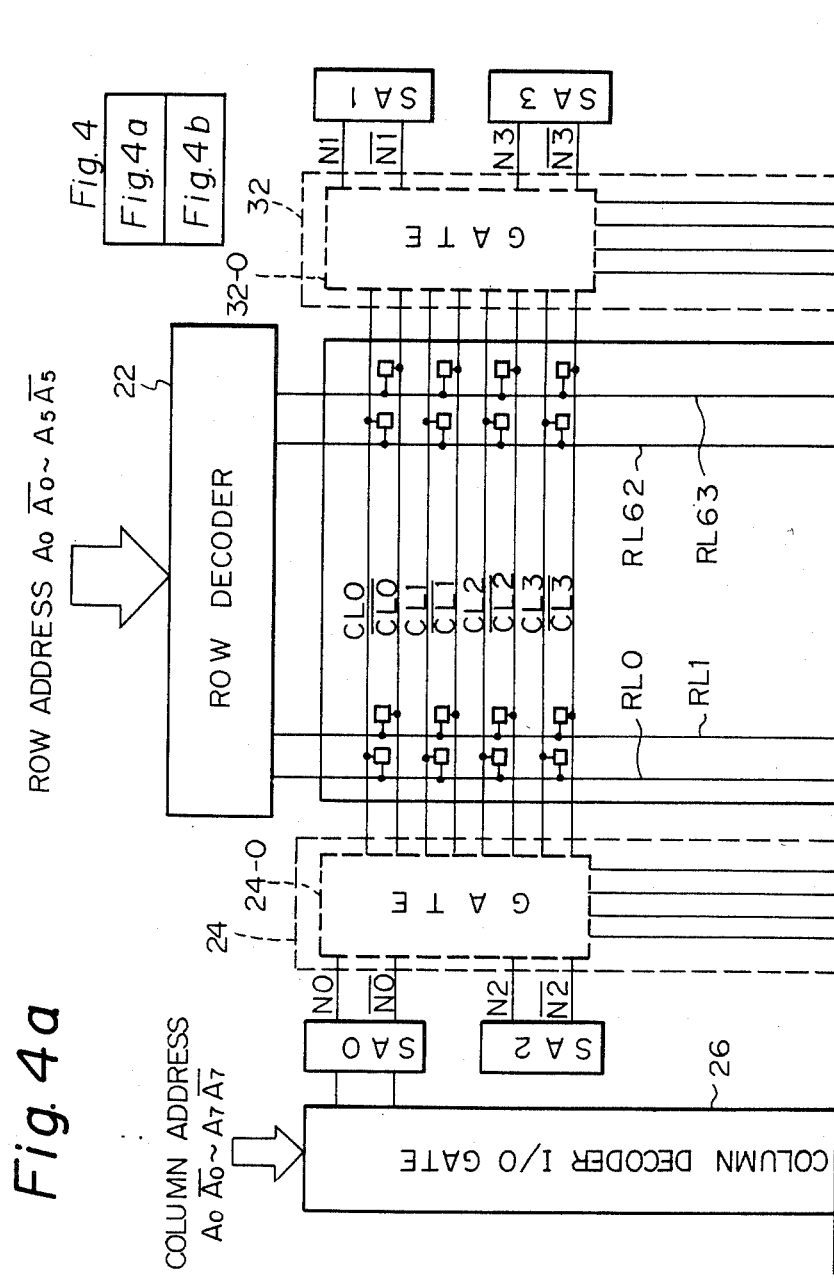

SEMICONDUCTOR MEMORY DEVICE

BACKGROUND OF THE INVENTION

1. Field of the Invention

The present invention relates to a dynamic memory using metal oxide semiconductor field effect transistors (MOSFET's).

2. Description of the Prior Art

A dynamic memory device of the single element type is not well-known. In such a memory, since each storage cell is composed of one FET and one capacitor, the size of each cell can be made very small. As the capacity of the memory increases, the size of each storage cell must decrease when overall dimensions are fixed. Therefore, the pitch (or the amount of space for each column) of the storage cells in a large capacity dynamic memory is small, making it difficult to place a sense amplifier, which has a complicated construction, at the end of each column of cells.

In a known dynamic memory device of the single element type, sense amplifiers are disposed on both sides of the storage cell array at one pitch intervals. In other words, in this prior art dynamic memory, sense amplifiers for accessing adjacent column lines are disposed on opposite sides of the storage cell array. According to this prior art device, twice the usual pitch space is available for each of the sense amplifiers, enabling the pitch to be further narrowed. However, a column decoder with an input/output (I/O) circuit must be provided on each side of the storage cell array. These column decoders occupy a large area of the device. Furthermore, the decoders require long address lines for connection thereto, and the load of the address lines becomes large. This makes it extremely difficult to layout the address lines and greatly decreases the access speed.

SUMMARY OF THE INVENTION

It is therefore an object of the present invention to provide a semiconductor memory device which can narrow the pitch of the storage cells without increasing the number of the column decoders.

The above object is achieved by a semiconductor memory device which includes a plurality of row lines; a plurality of column lines; a plurality of storage cells coupled to one of the row lines and to one of the column lines; a plurality of gate circuits connected to both ends of the column lines; a plurality of sense amplifiers located along both ends of the column lines and connected to the gate circuits; and a selection circuit for switching the gate circuits in response to at least one selection signal, so that a group of the column lines are connected via the gate circuits with a group of the sense amplifiers to perform a read operation and a refresh operation or a write operation of the storage cells connected thereto, and the remaining column lines are connected via the gate circuits with the remaining sense amplifiers to perform only the refresh operation on the remaining storage cells.

According to the present invention, only the sense amplifiers located on one side of the storage cell array are used for read or write operations of the storage cells. Thus, two column decoders are not necessary. In other words, only a single column decoder need be provided for the storage cell array, even though sense amplifiers are disposed on both sides of the array. Therefore, the pitch of storage cells can be narrowed without increasing the pattern area of the memory device and also without decreasing the access speed which would occur with the large load caused by long address lines.

BRIEF DESCRIPTION OF THE DRAWINGS

FIGS. 3a and 3b are waveform diagrams for explaining the read/write operation of the embodiment of FIG. 2;

DESCRIPTION OF THE PREFERRED EMBODIMENTS

Figure 1:
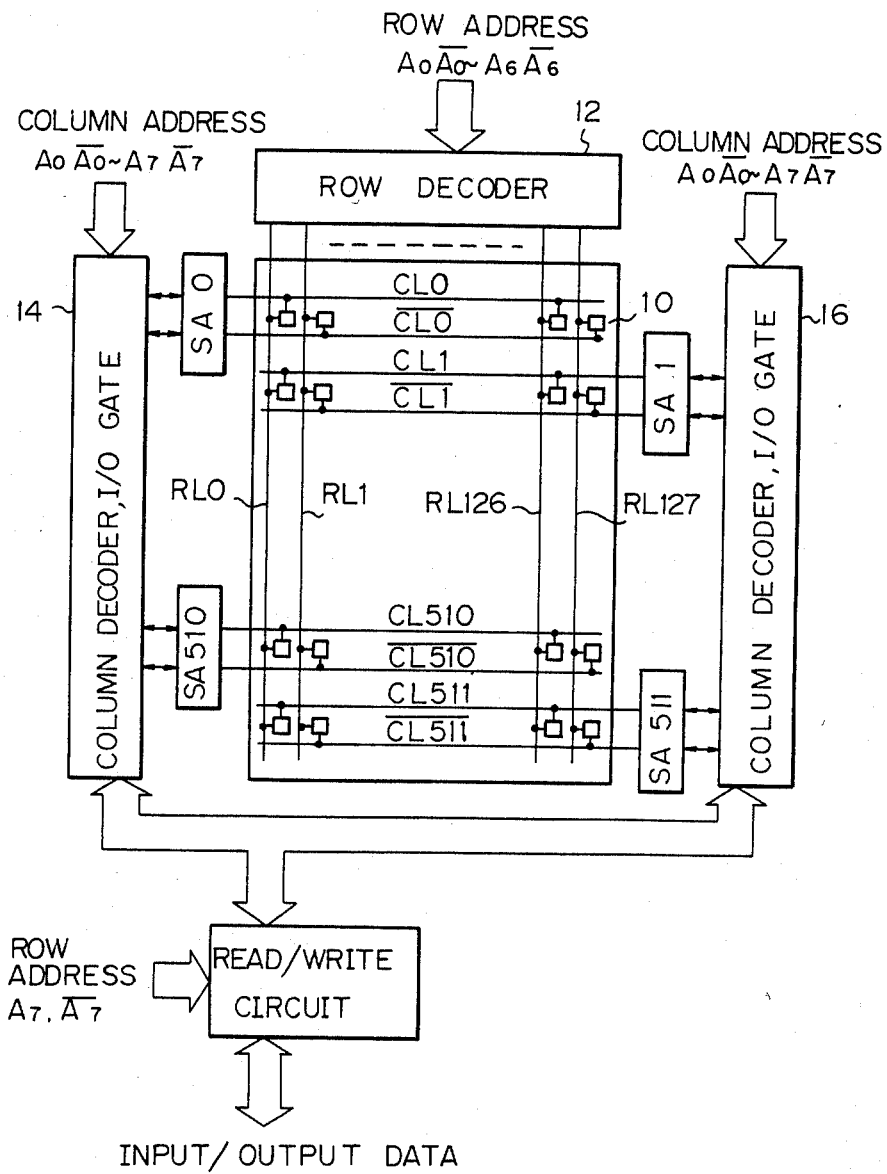
FIG. 1 is a block diagram of a memory device of the prior art.

Before describing a memory device of the present invention, a prior art memory device will be described for reference purposes. FIG. 1 illustrates a dynamic memory device with a storage capacity of 64 kbits according to the prior art. In FIG. 1, reference numeral 10 indicates one of a plurality of single element type storage cells arrayed in 128 rows and 512 columns. A row decoder (word decoder) 12 is coupled to the row lines (word lines) RL0 to RL127. Reference symbols CL0 and $\overline{CL0}$ to CL511 and $\overline{CL511}$ indicate pairs of column lines (bit lines). Sense amplifiers SA0 to SA511 are connected to each pair of the column lines. The sense amplifiers SA0, SA2, - - -, and SA510 indicated by even numbers are located on the left side of the storage cell array in FIG. 1, and the sense amplifiers SA1, SA3, - - -, and SA511 indicated by odd numbers are located on the right side of the array in FIG. 1. In this manner, the sense amplifiers are alternately disposed on opposite sides of the array. Therefore, twice and usual pitch space is available for each sense amplifier, enabling the pitch to be further narrowed without making construction of the sense amplifiers difficult. However, as mentioned before, such a memory device requires two column decoder and I/O gate circuits 14 and 16.

Figure 2:
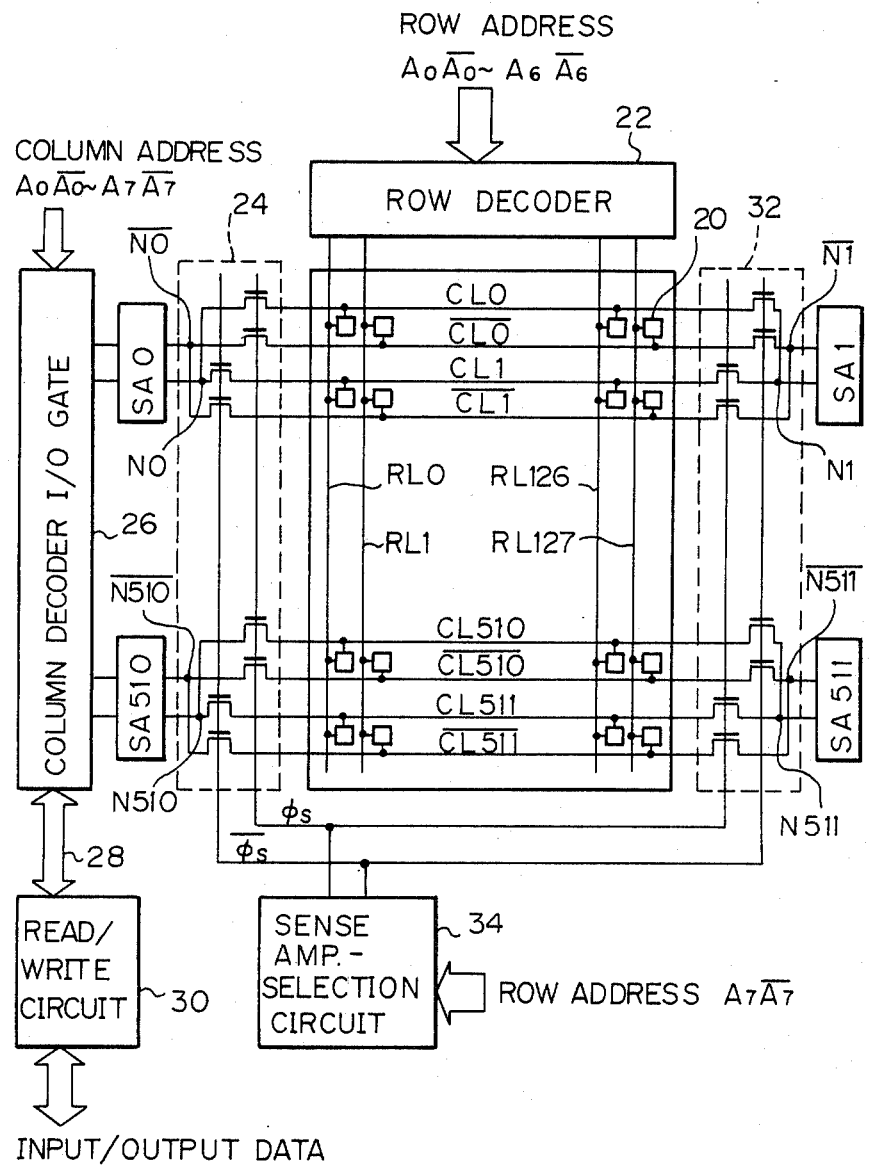
FIG. 2 is a block diagram of an embodiment of the present invention.

FIG. 2 illustrates an embodiment of the present invention. In FIG. 2, reference numeral 20 indicates one of a plurality of single element storage cells arrayed in 128 rows and in 512 columns. Each of the storage cells is composed of one MOSFET and a capacitor. In FIG. 2, reference symbols RL0 to RL127 indicate row lines (word lines). Reference symbols CL0 and $\overline{CL0}$ to CL511 and $\overline{CL511}$ indicate pairs of column lines (bit lines) crossing the row lines RL0 to RL127. Each of the storage cells is connected to one of the row lines RL0 to RL127 and to one of the column lines $\overline{CL0}$ to CL511 or CL0 to $\overline{CL511}$ at an intersection. A row decoder (word decoder) 22 is coupled to the end of the row lines RL0 to RL127 and selects one of 128 row lines in accordance with an upper 7 bit address $A_0\overline{A_0}$ to $A_6\overline{A_6}$ of the row address $A_0\overline{A_0}$ to $A_7\overline{A_7}$.

One of the ends of the column lines CL0 to CL511 and $\overline{CL0}$ to $\overline{CL511}$ can be connected to sense amplifiers indicated by even numbers SA0 SA2, - - -, SA508 and SA510 via bidirectional transfer gate elements composed of FET's. Reference numeral 24 in FIG. 2 indicates a gate circuit including these gate elements. Each of the sense amplifiers SA0, SA2, - - -, and SA510, includes a bistable circuit and an active pull-up circuit and is connected to two pairs of the column lines. For example, the column lines CL0 and $\overline{CL0}$, and CL1 and $\overline{CL1}$ are connectable to SA0, and CL2 and $\overline{CL2}$, and CL3 and $\overline{CL3}$ are connectable to SA2. The sense amplifiers SA0, SA2, - - -, and SA510 are also connected to a column decoder (bit decoder) and I/O gate circuit 26. The column decoder and I/O gate circuit 26 selects one of the even-numbered sense amplifiers 256 in accordance with the column address $A_0\overline{A_0}$ to $A_7\overline{A_7}$, and transfers information from the selected sense amplifier. In other words, data from a selected storage cell is transferred to a read/write circuit 30 via a data bus 28. The column decoder and I/O gate circuit 26 also transfers information from the read/write circuit 30 to the selected storage cell.

The other ends of the column lines CL0 to CL511 and $\overline{CL0}$ to $\overline{CL511}$ are connected to sense amplifiers indicated by odd numbers SA1, SA3, - - -, and SA511, via bidirectional transfer gate elements also composed of FET's. In FIG. 2, reference numeral 32 denotes a gate circuit including these gate elements. Each of the odd-numbered sense amplifiers SA1, SA3, - - -, and SA511, includes a bistable circuit and an active pull-up circuit and is coupled to two pairs of the column lines CLn and $\overline{CLn}$ as are the aforementioned even-numbered sense amplifiers SA0, SA2, - - -, and SA510. However, these sense amplifiers SA1, SA3, - - -, and SA511 are not connected to a column decoder. Therefore, information detected by the odd-numbered sense amplifiers SA1, SA3, - - -, and SA511 is amplified and then written in the original storage cell without being output. In other words, the odd-numbered sense amplifiers SA1, SA3, - - -, and SA511 are provided solely for refreshing the storage cells 20.

Each gate element (FET) in the gate circuits 24 and 32 has a control terminal (FET gate) connected to a sense amplifier selection circuit 34, and thus turns on or off in response to selection signals $\phi_S$ or $\overline{\phi}_S$ from the sense amplifier selection circuit 34. The sense amplifier selection circuit 34 produces the selection signals $\phi_S$ and $\overline{\phi}_S$ depending upon the least significant bit (LSB) $A_7$ and $\overline{A_7}$ of the row address.

When the selection signal $\phi_S$ has an "H" level and the inverse selection signal $\overline{\phi}_S$ has an "L" level, pairs of the even-numbered column lines CL0 and $\overline{CL0}$, CL2 and $\overline{CL2}$, - - -, and CL510 and $\overline{CL510}$ are connected with the even-numbered sense amplifiers SA0, SA2, - - -, and SA510 on the left side of FIG. 2, and pairs of the odd-numbered column lines CL1 and $\overline{CL1}$, CL3 and $\overline{CL3}$, - - -, and CL511 and $\overline{CL511}$ are connected with the odd-numbered sense amplifiers SA1, SA3, - - -, and SA511 on the right side of FIG. 2. Therefore, in this case, information on the pairs of the even-numbered column lines CL0 and $\overline{CL0}$, CL2 and $\overline{CL2}$, - - -, and CL510 and $\overline{CL510}$ is detected by the even-numbered sense amplifiers SA0, SA2, - - -, and SA510 and then fed to the column decoder and I/O gate circuit 26. The column decoder and I/O gate circuit 26 selects one of the 256 even-numbered sense amplifiers and obtains information on a desired column line CLi or writes information to a selected storage cell on a desired column line CLi. Meanwhile, information on the pairs of the odd-numbered column lines CL1 and $\overline{CL1}$, CL3 and $\overline{CL3}$, - - -, and CL511 and $\overline{CL511}$ is refreshed by the odd-numbered sense amplifiers SA1, SA3, - - - and SA511. In contrast with this, when the selection signal $\phi_S$ has the "L" level and $\overline{\phi}_S$ has the "H" level, information on the pairs of the odd-numbered column lines CL1 and $\overline{CL1}$, CL3 and $\overline{CL3}$, - - -, and CL511 and $\overline{CL511}$ is accessed.

FIGS. 3a and 3b illustrate waveforms of various signals in the embodiment of FIG. 2. Hereinafter, the read/write operation of the embodiment of FIG. 2 will be explained. At a time $t_1$, the row address $A_0\overline{A_0}$ to $A_7\overline{A_7}$ is received. Then, at a time $t_2$, a single row line RLi is selected (the voltage on a selected row line RLi rises) by the row decoder 22. At the same time, the selection signal $\phi_S$ rises to the "H" level, a voltage which is above the writing voltage of the storage cell 20. The writing voltage is higher than the supply voltage $V_{CC}$.

Thus, the column lines CLn and $\overline{CLn}$ connected to the sense amplifiers SAn. At a time $t_3$, information is output from the storage cells on the selected row line RLi to the respective column lines CLn and $\overline{CLn}$, causing differences in the voltages of the pairs of the column lines CL0 and $\overline{CL0}$, CL1 and $\overline{CL1}$, - - -, and CL511 and $\overline{CL511}$. At this time, since the selection signal $\phi_S$ has risen enough, the voltages on the column lines CLn and $\overline{CLn}$ are applied to the sense amplifiers $SA_0$, $SA_1$, - - -, and SA511, without a time delay. Since the selection signal $\phi_S$ has the "H" level, the pairs of the even-numbered column lines CL0 and $\overline{CL0}$ to CL510 and $\overline{CL510}$ are connected with the even-numbered sense amplifiers SA0 to SA510, and pairs of the odd-numbered column lines CL1 and $\overline{CL1}$ to CL511 and $\overline{CL511}$ are connected with the odd-numbered sense amplifiers SA1 to SA511. For instance, the pair of column lines CL0 and $\overline{CL0}$ is connected with the sense amplifier SA0, and the pair of column lines CL1 and $\overline{CL1}$ is connected with the sense amplifier SA1.

At a time $t_4$, the sense amplifiers SA0 to SA511 start to amplify the voltages received from the column lines CLn and $\overline{Cln}$. Thus, the nodes N0, $\overline{N0}$, N1, $\overline{N1}$ are charged or discharged to $V_{CC}$ or to $V_{SS}$. For instance, as shown in FIG. 3b, the nodes $\overline{N0}$ and N1 are charged to $V_{CC}$ and the nodes N0 and $\overline{N1}$ are discharged to $V_{SS}$. These amplified voltages are written to the storage cells 20 via the respective column lines CLn and $\overline{CLn}$. Thus, the refresh operation of the storage cells 20 is finished. It should be noted that, in this case ($\phi_S$="H"), the storage cells connected with the column lines CL0 and $\overline{CL0}$ are refreshed by the sense amplifier SA0, and the storage cells connected with the column lines CL1 and $\overline{CL1}$ are refreshed by the sense amplifier SA1 which is exclusively used for refreshing operations. At the time $t_4$, furthermore, the column addresses $A_0\overline{A_0}$ to $A_7\overline{A_7}$ are received. Thus, the information at one of the pairs of nodes N0, $\overline{N0}$, N2, $\overline{N2}$, - - -, N510, and $\overline{N510}$ is selected. The selected information is fed to the data bus 28 at a time $t_5$.

Figure 4B:
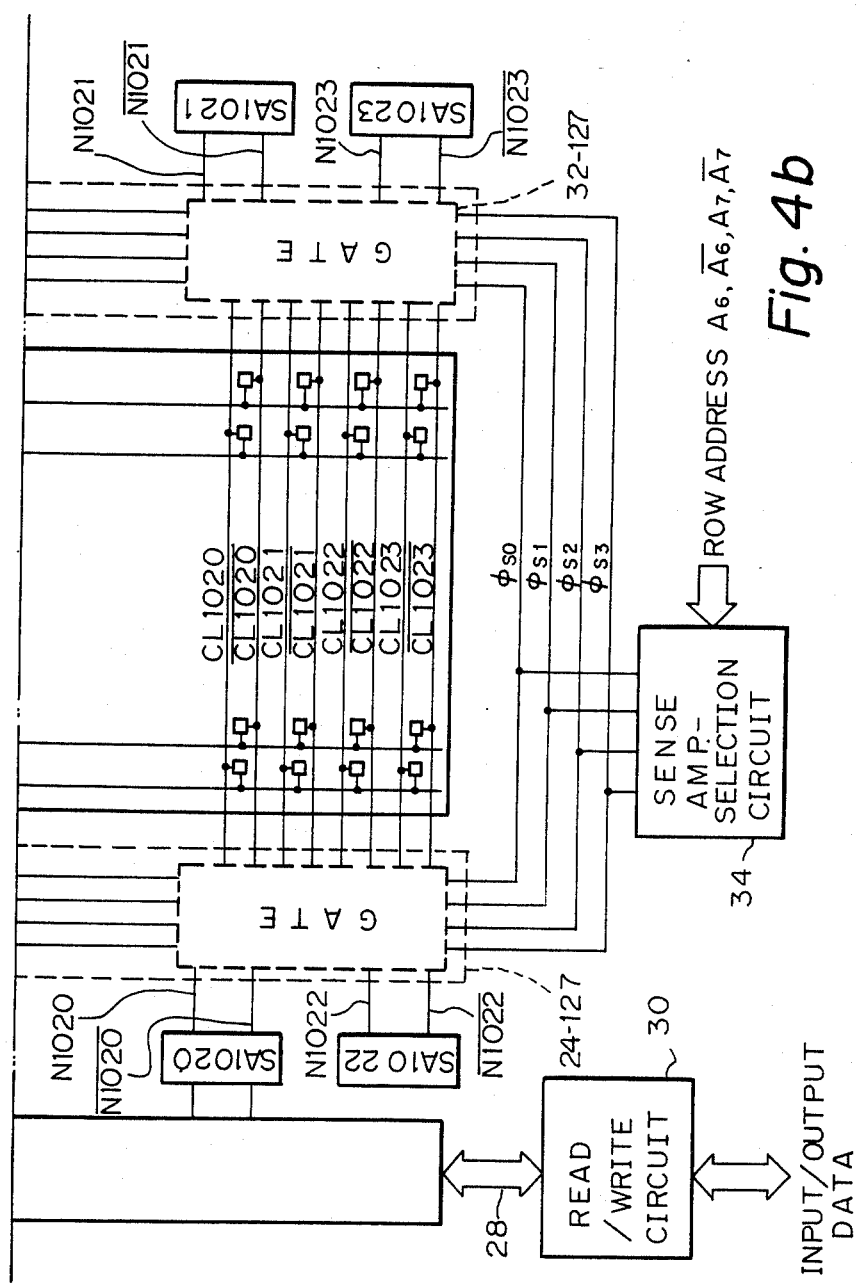
FIG. 4 which is separately illustrated as FIGS. 4a and 4b is a block diagram of another embodiment of the present invention.
Figure 5:
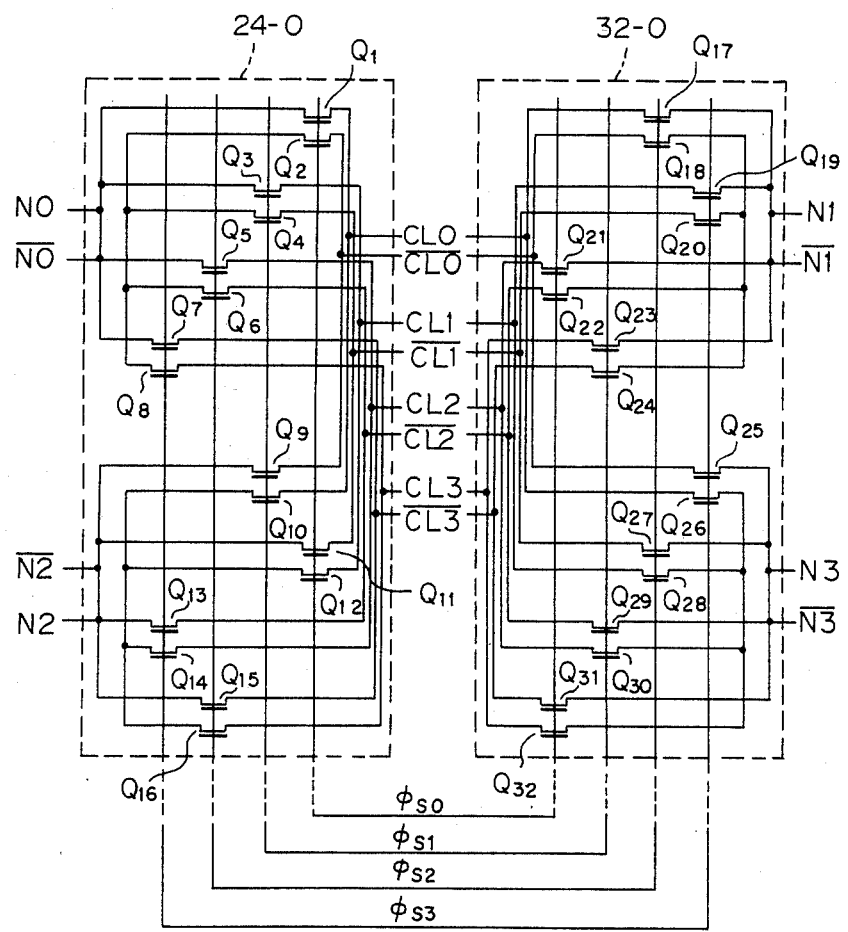
FIG. 5 is a circuit diagram of a part of the embodiment of FIG. 4.

FIG. 4 (including FIGS. 4a and 4b) illustrates another embodiment of the present invention, and FIG. 5 illustrates in detail a part of the gate circuits in the embodiment of FIG. 4. In the embodiment of FIG. 4, the storage cell array is coupled to 64 row lines and to 1024 column lines. One fourth of the 1024 sense amplifiers are connected to a column decoder and I/O gate circuit 26. The remaining sense amplifiers are exclusively used for refreshing operations. For instance, a sense amplifier SA0 is connected to the column decoder and I/O gate circuit 26, but sense amplifiers SA1, SA2, and SA3 are not connected to the column decoder 26. During a read/write operation, one of the pairs of the column lines CL0 and $\overline{CL0}$, CL1 and $\overline{CL1}$, CL2 and $\overline{CL2}$, and CL3 and $\overline{CL3}$ is connected to the sense amplifier SA0 and thus connected to the column decoder 26. The other pairs of the column lines are connected to the sense amplifiers SA1, SA2, and SA3 to perform only the refresh operation. This selection of pairs of the column lines CLn and $\overline{CLn}$ is accomplished by gate circuits 24 and 32, portions of which are shown in detail in FIG. 5. The gate circuits 24 and 32 are controlled by four selection signals $\phi_{S0}$ to $\phi_{S3}$ from a sense amplifier selection circuit 34. The sense amplifier selection circuit 34 produces the selection signal $\phi_{S0}$ to $\phi_{S3}$ in response to the lower two bits $A_6\overline{A_6}$ and $A_7\overline{A_7}$ of the row address. Since the operation of this latter embodiment is similar to the former embodiment, a detailed explanation of the operation is omitted.

Many widely different embodiments of the present invention may be constructed without departing from the spirit and scope of the present invention. It should be understood that the present invention is not limited to the specific embodiments described in this specification, except as defined in the appended claims.

We claim:

1. A semiconductor memory device receiving a selection signal, comprising:
    a plurality of row lines;
    a plurality of column lines, each of said column lines having two ends;
    a plurality of storage cells, operatively connected to one of said row lines and one of said column lines;
    a plurality of gate means, each having first and second ends, each of the first ends of said gate means operatively connected to one of the ends of said column lines, for controlling connections to said column lines;
    a plurality of sense amplifiers disposed along both ends of said column lines, each operatively connected to the second end of one of said gate means, and comprising first and second groups of sense amplifiers; and
    a selection circuit, operatively connected to said gate means for controlling said gate means in response to the selection signal to connect a selected group of said column lines via selected gate means to the first group of said sense amplifiers for accessing information in selected storage cells and to connect an unselected group of said column lines via unselected gate means to the second group of said sense amplifiers for performing only a refresh operation on unselected storage cells operatively connected to the unselected group of said column lines.

2. A semiconductor memory device as claimed in claim 1, wherein said gate means comprise bidirectional transfer gate elements, each of said bidirectional transfer gate elements operatively connected to one of said column lines, one of said sense amplifiers and said selection circuit.

3. A semiconductor memory device as claimed in claim 2, wherein each of said bidirectional transfer gate elements comprises a field effect transistor having a gate operatively connected to said selection circuit and source and drain regions operatively connected between one of said column lines and one of said sense amplifiers.

4. A semiconductor memory device as claimed in claim 3, wherein said storage cells having a writing voltage and said selection circuit provides a selection voltage higher than the writing voltage of said storage cells to the gate of each of said field effect transistors in the selected gate means.

5. A semiconductor memory device as claimed in claim 1, wherein each of said sense amplifiers comprises bistable and active pull-up circuits operatively connected to one of said gate means.

6. A semiconductor memory device as claimed in claim 1, wherein each of said storage cells comprises:
    a field effect transistor, operatively connected to one of said column lines, having a gate operatively connected to one of said row lines; and
    a capacitor, operatively connected to said field effect transistor.

7. A semiconductor memory device as claimed in claim 1, wherein said semiconductor memory device receives row address data and the selection signal is a part of the row address data.

8. A semiconductor memory device receiving row and column addresses and a selection signal, comprising:
    a plurality of row lines having ends;
    a plurality of pairs of column lines, each of said column lines having first and second ends;
    a plurality of storage cells, each of said storage cells operatively connected to one of said row lines and one of said column lines;
    a plurality of gate means disposed along the first and second ends of said column lines, each of said gate means having a first end operatively connected to one of the ends of the pairs of said column lines and a second end, for controlling connections to said column lines;
    a plurality of sense amplifiers disposed along the first and second ends of said column lines, each operatively connected to the second end of one of said gate means, and comprising first and second groups of sense amplifiers;
    row decoder means, disposed along and operatively connected to the ends of said row lines and operatively connected to receive the row address, for selecting one of said row lines in dependence upon the row address;
    column decoder means, disposed along the first end of said column lines and operatively connected to the first group of said sense amplifiers and to receive the column address, for selecting among said pairs of column lines in dependence upon the column address; and
    a selection circuit, operatively connected to said gate means and to receive the selection signal, for switching said gate means in response to the selection signal to connect selected pairs of column lines via selected gate means to the first group of said sense amplifiers for accessing information in selected storage cells and to connect unselected pairs of column lines via unselected gate means to the second group of said sense amplifiers for performing only a refresh operation on unselected storage cells connected to the unselected pairs of column lines.

9. A semiconductor memory device as claimed in claim 8, wherein said gate means comprise bidirectional transfer gate elements, each of said bidirectional transfer gate elements operatively connected to one of said column lines, one of said sense amplifiers and said selection circuit.

10. A semiconductor memory device as claimed in claim 9, wherein each of said bidirectional transfer gate elements comprises a field effect transistor having a gate operatively connected to said selection circuit and source and drain regions operatively connected between one of said column lines and one of said sense amplifiers.

11. A semiconductor memory device as claimed in claim 10, wherein said storage cells have a writing voltage and said selection circuit provides a voltage higher than the writing voltage of said storage cells to the gate of each of said field effect transistors in the selected gate means.

12. A semiconductor memory device as claimed in claim 8, wherein each of said sense amplifiers comprises bistable and active pull-up circuits operatively connected to one of said gate means.

13. A semiconductor memory device as claimed in claim 8, wherein each of said storage cells comprises:
   a field effect transistor, operatively connected to one of said column lines and one of said row lines; and
   a capacitor operatively connected to said field effect transistor.

14. A semiconductor memory device as claimed in claim 8 and receiving row address data, wherein the selection signal and the row address are received together as the row address data.

15. A semiconductor memory device receiving row and column addresses and a selection signal, comprising:
   a plurality of row lines having ends;
   a plurality of pairs of column lines intersecting said row lines at intersections thereof, each of said column lines having first and second ends;
   a plurality of storage cells, each of said storage cells operatively connected to one of said row lines and one of said column lines at the intersection thereof;
   a plurality of gate means disposed along both ends of said column lines, each operatively connected to one of the ends of the pairs of said column lines, for controlling connections to said column lines;
   a plurality of sense amplifiers disposed along both ends of said column lines, each of said sense amplifiers operatively connected to said gate means and operatively connectable to two pairs of said column lines via said gate means;
   row decoder means disposed along and operatively connected to the ends of said row lines and operatively connected to receive the row address, for selecting one of said row lines in dependence upon the row address;
   column decoder means, disposed along the first ends of said column lines and operatively connected to said sense amplifiers disposed along the first ends of said column lines and to receive the column address, for selecting among said pairs of column lines in dependence upon the column address; and
   a selection circuit, operatively connected to said gate means and to receive a portion of the row address, for switching said gate means in dependence upon the portion of the row address to connect selected pairs of column lines via selected gate means to said sense amplifiers disposed along the first ends of said column lines for accessing information in a selected storage cell, and to connect pairs of column lines via unselected gate means to said sense amplifiers disposed along the second ends of said column lines for performing only a refresh operation on unselected storage cells.

16. A semiconductor memory device as claimed in claim 15, wherein said gate means comprise bidirectional transfer gate elements, each of said bidirectional transfer gate elements operatively connected to one of said column lines, one of said sense amplifiers and said selection circuit.

17. A semiconductor memory device as claimed in claim 16, wherein each of said bidirectional transfer gate elements comprises a field effect transistor having a gate operatively connected to said selection circuit and source and drain regions operatively connected between one of said column lines and one of said sense amplifiers.

18. A semiconductor memory device as claimed in claim 17, wherein said storage cells have a writing voltage and said selection circuit provides a voltage higher than the writing voltage of said storage cells to the gate of each of said field effect transistors in the selected gate means.

19. A semiconductor memory device as claimed in claim 15, wherein each of said sense amplifiers comprises bistable and active pull-up circuits operatively connected to one of said gate means.

20. A semiconductor memory device as claimed in claim 15, wherein each of said storage cells comprises:
   a field effect transistor operatively connected to one of said column lines and one of said row lines; and
   a capacitor operatively connected to said field effect transistor.

21. A semiconductor memory device receiving row and column addresses, comprising:
   a memory cell array having first and second sides and storage cells therein;
   first gate means, adjacent to the first side of said memory cell array and operatively connected to the storage cells, for selecting a portion of the storage cells;
   second gate means, adjacent to the second side of said memory cell array and operatively connected to the storage cells, for selecting the remainder of the storage cells;
   a first group of sense amplifiers, adjacent and operatively connected to said first gate means, for accessing the portion of the storage cells;
   a second group of sense amplifiers, adjacent and operatively connected to said second gate means, for performing a refresh operation on the remainder of the storage cells;
   a row address decoder operatively connected to said memory cell array;
   a column decoder, adjacent and operatively connected to said first group of sense amplifiers, for selecting a sense amplifier in dependence upon the column address;
   selection means, receiving part of the row address and operatively connected to said first and second gate means, for controlling said first and second gate means in dependence upon the part of the row address.

* * * * *